United States Patent
Omura et al.

(10) Patent No.: US 8,801,912 B2
(45) Date of Patent: Aug. 12, 2014

(54) CONTINUOUS COPPER ELECTROPLATING METHOD

(75) Inventors: Naoyuki Omura, Hirakata (JP); Toshihisa Isono, Hirakata (JP); Koji Shimizu, Hirakata (JP); Shinji Tachibana, Hirakata (JP); Tomohiro Kawase, Hirakata (JP); Shunsaku Hoshi, Hirakata (JP)

(73) Assignee: C. Uyemura & Co., Ltd., Osaka-shi (JP)

(*) Notice: Subject to any disclaimer, the term of this patent is extended or adjusted under 35 U.S.C. 154(b) by 408 days.

(21) Appl. No.: 12/401,113

(22) Filed: Mar. 10, 2009

(65) Prior Publication Data

US 2009/0229986 A1    Sep. 17, 2009

(30) Foreign Application Priority Data

Mar. 11, 2008   (JP) .................................. 2008-060735

(51) Int. Cl.
*C25D 21/18* (2006.01)
*C25D 17/00* (2006.01)
*C25D 3/38* (2006.01)
*H05K 3/24* (2006.01)

(52) U.S. Cl.
CPC ............... *C25D 17/00* (2013.01); *C25D 21/18* (2013.01); *C25D 3/38* (2013.01); *H05K 3/241* (2013.01)
USPC .............. 205/101; 205/99; 205/296; 204/263

(58) Field of Classification Search
USPC ........................................................ 205/101
See application file for complete search history.

(56) References Cited

U.S. PATENT DOCUMENTS

| | | | |
|---|---|---|---|
| H36 H * | 3/1986 | Smith ............................. | 205/81 |
| 5,976,341 A | 11/1999 | Schumacher et al. | |
| 5,997,712 A * | 12/1999 | Ting et al. ..................... | 205/101 |
| 6,024,856 A | 2/2000 | Haydu et al. | |
| 6,238,529 B1 * | 5/2001 | Geissler et al. ............... | 204/202 |
| 2004/0072423 A1 * | 4/2004 | Jorne et al. .................... | 438/687 |
| 2004/0245112 A1 * | 12/2004 | Sekimoto et al. ............. | 205/133 |

(Continued)

FOREIGN PATENT DOCUMENTS

| | | |
|---|---|---|
| CN | 1281517 A | 1/2001 |
| JP | 8-507106 A | 7/1996 |

(Continued)

OTHER PUBLICATIONS

Chinese Office Action issued on Jul. 22, 2011 in corresponding Chinese Application No. 200910127431.3.

(Continued)

*Primary Examiner* — Bryan D. Ripa
(74) *Attorney, Agent, or Firm* — Birch, Stewart, Kolasch & Birch, LLP

(57) ABSTRACT

Disclosed is a method for a repeated electroplating of a workpiece to be plated as a cathode by using an insoluble anode in a plating vessel accommodating a copper sulfate plating bath, wherein a copper dissolution vessel different from the plating vessel is provided, the plating bath is transferred to the copper dissolution vessel and is returned from the copper dissolution vessel to the plating vessel for circulating the plating bath between the plating vessel and the copper dissolution vessel, copper ion supplying salt is charged into the copper dissolution vessel and dissolved in the plating bath so that copper ions consumed by the plating can be replenished, and the workpiece to be plated is continuously electroplated, characterized in that the plating bath is permitted to transfer between the anode side and the cathode side, and the plating bath is returned to vicinity of the anode in the return of the plating bath from the copper dissolution vessel to the plating vessel. Plating performance impairing components, which are produced when the copper ion supplying salt is dissolved in the plating bath for replenishing the copper ions, are oxidized and decomposed, whereby defective plating due to the presence of the plating performance impairing components can be prevented.

4 Claims, 4 Drawing Sheets

(56) References Cited

U.S. PATENT DOCUMENTS

2005/0006241 A1* 1/2005 McHugh et al. ............... 205/80
2005/0051425 A1* 3/2005 Wang et al. ............... 204/275.1
2005/0205429 A1* 9/2005 Gebhart et al. ............... 205/148
2005/0274620 A1* 12/2005 Kovarsky et al. ............. 205/101
2006/0207875 A1* 9/2006 Lee et al. ................... 204/275.1

FOREIGN PATENT DOCUMENTS

| | | | |
|---|---|---|---|
| JP | 10-121297 | A | 5/1998 |
| JP | 2000-109998 | A | 4/2000 |
| JP | 2001-316893 | A | 11/2001 |
| JP | 2004-269955 | A | 9/2004 |
| JP | 2005-187869 | A | 7/2005 |
| JP | 3903120 | B2 | 1/2007 |

OTHER PUBLICATIONS

Office Action for corresponding Japanese Patent Application No. 2009-050114, dated Feb. 19, 2013.

* cited by examiner

CONTINUOUS COPPER ELECTROPLATING METHOD

BACKGROUND OF THE INVENTION

1. Field of the Invention

The present invention relates to a method for continuous copper electroplating of a workpiece to be plated by use of a copper sulfate plating bath.

2. Description of the Related Art

In the electroplating conducted using an insoluble anode together with a copper sulfate plating bath, the absence of dissolution of copper from the anode results in that the copper concentration in the plating bath decreases as the electroplating proceeds. In order to restore the lowered copper concentration to a level suitable for copper plating, therefore, a copper salt such as copper oxide, copper carbonate, and copper hydrate is supplied as a copper ion supplying salt.

However, those of the copper ion supplying salts which are high in purity are expensive. In many cases, therefore, inexpensive copper ion supplying salts which contain organic impurities or the like, such as the copper oxide recycled from waste etching solutions, are used. Besides, since the reactions for dissolving the copper ion supplying salts may be exothermic, additives present in the plating bath may be denatured during the reactions. Therefore, the use of such copper ion supplying salts may exert adverse effects on the plating; specifically, it may lead to generation of defective appearance or to degradation in throwing power and/or hole filling (plugging) performance.

To cope with the bad influences on plating, the plating performance impairing components (the components detrimental to plating performance) have hitherto been removed by treating the plating bath with active carbon. Or, alternatively, air bubbling has been applied to metallic copper in the plating bath to effect oxidation and decomposition, thereby converting the plating performance impairing components into components which are not detrimental to plating. Particularly, the active carbon treatment has the problem of lowered productivity, since it is necessary to perform the treatment periodically by stopping the plating process, for removing the plating performance impairing components.

As a method for supplying copper ions into a plating bath, for example, JP-A 2000-109998 discloses a plating method in which an anode chamber provided near an insoluble anode is used. This method, however, has the following problem. In the method, the transport of the plating bath to and from the dissolution vessel is carried out on the anode side in the anode chamber isolated by a membrane which substantially is impermeable to the plating bath. Particularly in the case where the current density is high and the metal dissolution cycle is rapid, therefore, the rate of migration of metallic ions from the anode chamber to the cathode is controlled (limited) by permeation through the membrane. Consequently, the supply of metallic ions to the cathode is delayed, and the metallic ion concentration in the vicinity of the cathode would be lowered. Thus, it is difficult to maintain good plating quality.

Besides, JP-T Hei 8-507106 discloses a method and apparatus for electrolytic deposition of a metal layer. In the method and apparatus, however, the plating bath returned from a metallic ion generator is supplied directly to the cathode, so that plating performance lowering components derived from the metallic ion supplying salts are supplied directly to the cathode, to lower the plating performance. Also, in the copper sulfate plating method described in Japanese Patent No. 3903120, there is the same problem as above because the plating bath is returned from the copper oxide dissolution vessel to the cathode side.

Incidentally, in addition to the above-mentioned patent documents, JP-A 2005-187869 is cited as a prior-art reference.

SUMMARY OF THE INVENTION

The present invention has been made in consideration of the above-mentioned circumstances. Accordingly, it is an object of the present invention to provide a method for a continuous copper electroplating of a workpiece to be plated, such as printed wiring boards, by using a copper sulfate plating bath and an insoluble anode, wherein the plating bath is supplied with a copper ion supplying salt for replenishing the copper ions consumed by the plating, characterized in that plating performance impairing components generated from the replenishing operation, specifically, the plating performance impairing components derived from the copper ion supplying salt mixed into the plating bath and the plating performance impairing components produced under the heat of solution of the copper ion supplying salt are efficiently oxidized and decomposed, whereby the workpiece can be continuously electroplated while maintaining good plating film characteristics.

In electroplating by use of an insoluble anode, oxygen gas is evolved at the anode and, therefore, an extremely highly oxidizing atmosphere is established in the vicinity of the anode. The present inventors have paid attention to the insoluble anode. Specifically, as a result of their intensive and extensive investigations for solving the above-mentioned problems, the present inventors have found out the following. In a method for a continuous (or repeated) electroplating of a workpiece to be plated as a cathode by using an insoluble anode in a plating vessel accommodating a copper sulfate-plating bath, when a method in which a copper dissolution vessel different from the plating vessel is provided, the plating bath is transferred to the copper dissolution vessel and is returned from the copper dissolution vessel to the plating vessel for circulating the plating bath between the plating vessel and the copper dissolution vessel, and a copper ion supplying salt (copper oxide) is charged into the copper dissolution vessel and dissolved in the plating bath is used as a method for replenishing the copper ions in the plating bath consumed by the plating, and the plating bath is transferred to the vicinity of the anode in the transport of the plating bath from the copper dissolution vessel to the plating bath in the condition where the plating bath is permitted to transfer between anode and cathode, then plating performance impairing components can be oxidized and decomposed in the vicinity of the insoluble anode, and the plating performance impairing components can be converted by the oxidation and decomposition into components having no adverse effect on the plating performance. It was thus found possible, by such a process, to efficiently obviate the bad influences of the plating performance impairing components arising from the replenishing of the copper ions by feeding the copper ion supplying salt, and to perform a copper electroplating continuously for a long time. Based on these findings, the present invention has been accomplished.

According to the present invention, there is provided a method for a repeated electroplating of a workpiece to be plated as a cathode by using an insoluble anode in a plating vessel accommodating a copper sulfate plating bath, wherein a copper dissolution vessel different from the plating vessel is provided, the plating bath is transferred to the copper dissolution vessel and is returned from the copper dissolution vessel to the plating vessel for circulating the plating bath between the plating vessel and the copper dissolution vessel, copper ion supplying salts are charged into the copper dissolution vessel and dissolved in the plating bath so that copper ions consumed by the plating can be replenished, and the workpiece to be plated is continuously electroplated, characterized in that the anode and cathode are not isolated or are isolated by a membrane which permits the plating bath to transfer between the anode side and cathode side, and the plating bath is transferred to vicinity of the anode in the transport of the plating bath from the copper dissolution vessel to the plating vessel.

In this case, in the transport of the plating bath from the plating vessel to the copper dissolution vessel, preferably, the plating bath is transferred from a position which is nearer to the cathode than to the anode.

In addition, preferably, the anode and cathode are isolated by a membrane which permits the plating bath to transfer between the anode side and the cathode side, and the plating bath is returned to the anode side of the membrane in the return of the plating bath from the copper dissolution vessel to the plating vessel. Further, preferably, the plating bath is transferred from the cathode side of the membrane in the transport of the plating bath from the plating vessel to the copper dissolution vessel.

According to the present invention, the plating performance impairing components generated upon dissolution of the copper ion supplying salts for replenishing the copper ions are oxidized and decomposed, and, therefore, it is possible to prevent defective plating from being caused by the plating performance impairing components.

In addition, even in the case where fine particles remaining undissolved upon dissolution of the copper ion supplying salts are contained in the plating bath returned to the plating vessel, the return of the plating bath into the vicinity of the anode where oxygen gas is evolved ensures that the fine particles can be dissolved with the aide of bubbling of oxygen gas. Therefore, it is possible to prevent defective plating from arising from unsatisfactory dissolution of the copper ion supplying salts. Further, the plating performance impairing components can be oxidized and decomposed on the surface of the insoluble anode simultaneously with the progress of plating. Therefore, unlike in the case of the active carbon treatment, there is no need to stop the production so as to perform some treatment of the plating bath, and productivity can be prevented from being lowered.

DETAILED DESCRIPTION OF THE PREFERRED EMBODIMENTS

Figure 1:
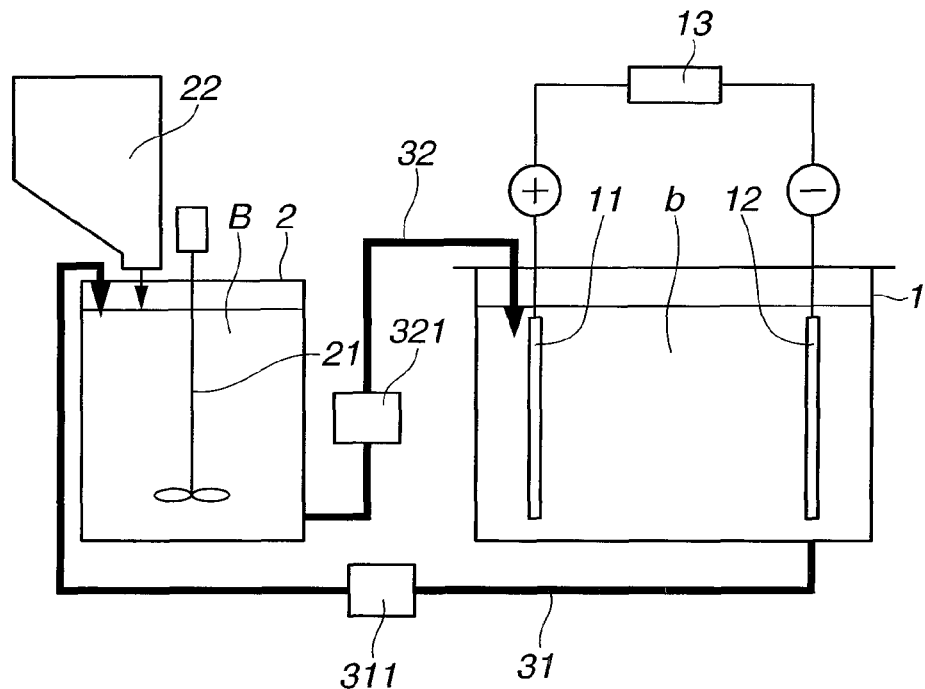
FIG. 1 is a schematic illustration of an example of a plating apparatus suitable for preferred application of the continuous copper electroplating method according to the present invention.

In the copper electroplating method according to the present invention, a workpiece to be plated as a cathode is electroplated with copper by using an insoluble anode in a plating vessel accommodating a copper sulfate plating bath. In copper electroplating using an insoluble anode, the copper ions in the plating bath which are consumed by plating have to be replenished, as required. In the present invention, a copper dissolution vessel is provided separately from the plating vessel, as a vessel into which copper salts such as copper oxide, copper carbonate and copper hydroxide are charged as copper ion supplying salts (copper compounds). Besides, the plating bath is transferred from the plating vessel to the copper dissolution vessel and is returned from the copper dissolution vessel to the plating vessel, whereby the plating bath is circulated between the plating vessel and the copper dissolution vessel, while the copper ion supplying salts are charged into the copper dissolution vessel and dissolved in the plating bath.

By this dissolution operation, the plating bath transferred from the plating vessel to the copper dissolution vessel is raised in copper concentration through dissolution of the copper ion supplying salts in the copper dissolution vessel, so that the plating bath having a higher copper concentration than that of the plating bath in the plating vessel is returned from the copper dissolution vessel to the plating vessel. The dissolution of the copper ion supplying salts increases also the concentrations of plating performance impairing components (components which degrade the plating characteristics) in the copper dissolution vessel, such as impurities (particularly, organic impurities) contained in the copper ion supplying salts and denatured products formed through denaturation of organic additives contained in the plating bath due to the heat of dissolution of copper and the like.

In the present invention, the anode and the cathode are not isolated or are isolated by a membrane which permits the plating bath to transfer between the anode side and the cathode side of the membrane; in short, a condition where the plating bath can transfer between anode and cathode is established. In addition, in returning the plating bath from the copper dissolution vessel to the plating vessel, the plating bath raised in copper concentration and also in concentrations of the plating performance impairing components is returned to the vicinity of the insoluble anode, serving for plating, in the plating vessel. Besides, in this case, preferably, the plating bath is transferred from a position which is nearer to cathode than to anode in the plating bath in the transport of the plating bath from the plating vessel to the copper dissolution vessel. In electroplating by use of an insoluble anode, an extremely highly oxidizing atmosphere is established in the vicinity of the anode because of the evolution of oxygen gas on the anode during electroplating (during application of an electric current). For example, when the plating bath is returned in such a manner that the bubbles of oxygen gas in the vicinity of the anode are mixed with the plating bath returned there from the copper dissolution vessel, the plating bath raised in concentrations of the plating performance impairing components is efficiently put in the oxidizing atmosphere in the vicinity of the anode. As a result, the plating performance impairing components are efficiently oxidized and decomposed in the vicinity of the insoluble anode, and, by the oxidation and decomposition, the plating performance impairing components can be converted into components which have no adverse effect on the plating performance. Thus, it is possible to efficiently obviate the bad influences exerted on plating by the plating performance impairing components arising from the replenishing of copper ions by feeding the copper ion supplying salts. Consequently, it is possible to perform copper electroplating continuously for a long time. Incidentally, the continuous plating according to the present invention means plating a workpiece or workpieces to be plated repeatedly and continuedly for a predetermined period of time, without replacing the plating bath or carrying out a regenerating treatment. The continuous plating in the present invention is not limited to the case of plating by continuous application of electric current during the predetermined period of time, but includes the case of repeating plating while replacing the workpiece(s) to be plated by batch operations. Further, the continuous plating in the present invention may be continuous plating conducted while feeding the workpiece to be plated (cathode) in the plating bath.

In the present invention, the plating bath in which the copper ion supplying salts have been dissolved is returned to the vicinity of the anode. In this case, the anode and cathode may not necessarily be isolated from each other by a membrane. Where the anode and cathode are not isolated, the plating bath with the copper ion supplying salts dissolved therein will easily transfer from the anode side to the cathode side in the plating vessel. Besides, even in the case where the anode and cathode are isolated, a membrane permitting the plating bath to pass therethrough is used for the isolation, so that the plating bath is sufficiently supplied from the anode side to the cathode side. Therefore, particularly when the plating bath lowered in copper ion concentration in the vicinity of the cathode is preferentially returned to the copper dissolution vessel and the plating bath with copper ions replenished in the copper dissolution vessel is preferentially returned to the anode side, it is possible to keep constant the copper ion concentration in the vicinity of the cathode, and to continuously perform copper electroplating with a stable plating quality.

Now, the present invention will be described more in detail below, referring to the drawings, as required.

FIG. 1 is a schematic illustration of an example of a plating apparatus suitable for preferred application of the continuous copper electroplating method according to the present invention. In FIG. 1, symbol 1 denotes a plating vessel, and symbol 2 a copper dissolution vessel. The plating vessel 1 accommodates a plating bath (b), in which an insoluble anode 11 and a workpiece to be plated 12 are immersed, and an electric current supplied from a power source device 13 is passed therebetween, whereby the workpiece 12 is electroplated with copper. In addition, though copper (copper ions) is consumed as the copper electroplating is continued, the copper ions consumed by the plating are replenished from a copper ion supplying salt reservoir 22 into the plating bath B in the copper dissolution vessel 2. The copper ion supplying salts supplied into the copper dissolution vessel 2, in this case, are mixed and dissolved into the plating bath B by a mixer (in the case shown, a mechanical agitator) 21.

On the other hand, the plating bath (the plating bath in the plating vessel) (b) is transferred from the plating vessel 1 to the copper dissolution vessel 2 through a transfer conduit 31 by a pump 311, and the plating bath (the plating bath in the copper dissolution vessel) B is returned from the copper dissolution vessel 2 to the plating vessel 1 through a return conduit 32 by a pump 321, for circulating the plating bath between the plating vessel 1 and the copper dissolution vessel 2. By this circulation, the plating bath (the plating bath in the copper dissolution vessel) B is returned from the copper dissolution vessel 2 to the vicinity of the insoluble anode 11 in the plating vessel 1, and the copper ion supplying salts charged into the copper dissolution vessel 2 are supplied as copper ions into the plating vessel 1, and the plating bath B in the copper dissolution vessel which is high in concentrations of plating performance inhibiting components is supplied into the oxidizing atmosphere in the vicinity of the anode 11. Besides, in this case, the plating bath (b) to be transferred from the plating vessel 1 to the copper dissolution vessel 2 is drawn out from a position which is nearer to the cathode 12 than to the anode 11 in the plating vessel 1, preferably from the vicinity of the cathode 12 (for example, in the case shown, from a position just under the cathode 12), and transferred.

The present invention is effective because, where the copper concentration in the plating bath in the copper dissolution vessel is higher than the copper concentration in the plating bath in the plating vessel, the concentrations of the plating performance impairing components are also higher in the plating bath in the copper dissolution vessel than in the plating bath in the plating vessel. The copper concentration in the plating bath in the plating vessel and that in the plating bath in the copper dissolution vessel are not particularly limited; preferably, however, the ratio of (the copper concentration in the plating bath in the copper dissolution vessel)/(the copper concentration in the plating bath in the plating vessel) is more than 1 and not more than 10, more preferably, more than 1 and not more than 5.

Besides, in order that the plating bath in the copper dissolution vessel which is high in concentrations of plating performance impairing components is efficiently put into the oxidizing atmosphere in the vicinity of the anode, it is preferable to isolate the insoluble anode and the cathode by a membrane and to return the plating bath to the anode side of the membrane in the return of the plating bath from the copper dissolution vessel to the plating vessel. As the membrane, there can be used known membranes for isolating anode and cathode which are ordinarily used for plating in a copper sulfate plating bath, such as ion exchange membranes and membranes woven from acid-resistant resin such as PP fiber. When the plating bath is returned to the anode side of the membrane in the return of the plating bath from the copper dissolution vessel to the plating bath, a zone of a high copper concentration is once maintained in a predetermined range on the anode side of the membrane, and the copper ions are supplied to the other side (cathode side) of partition by the membrane inside the plating vessel by way of this zone. In this case, the concentrations of the plating performance impairing components are also high in the high-copper-concentration zone, which promises more efficient oxidation and decomposition of the plating performance impairing components.

Figure 2:
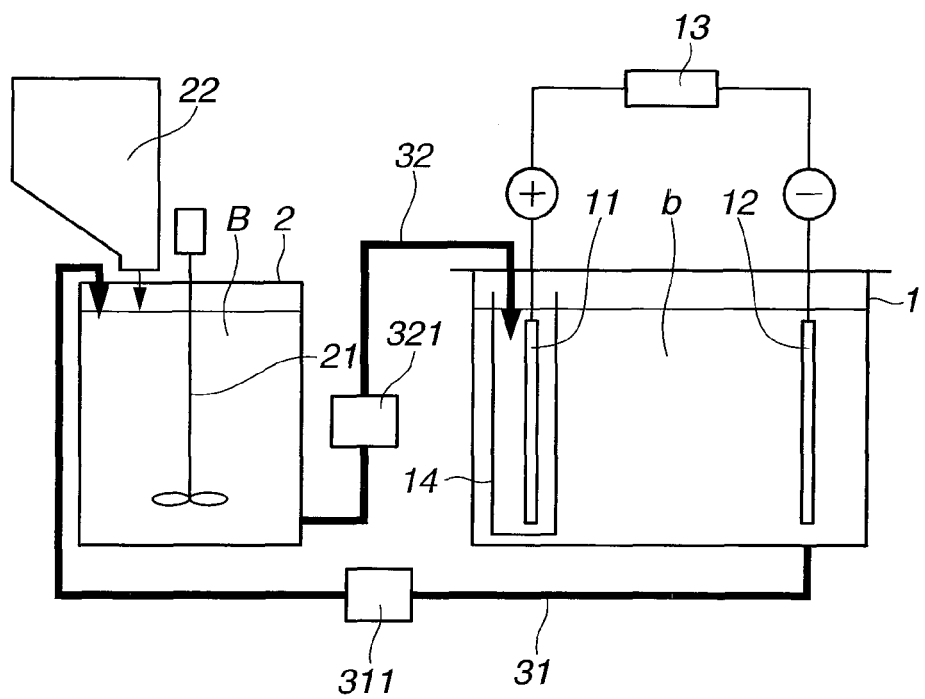
FIG. 2 is a schematic illustration of another example of a plating apparatus suitable for preferred application of the continuous copper electroplating method according to the invention.
Figure 3:
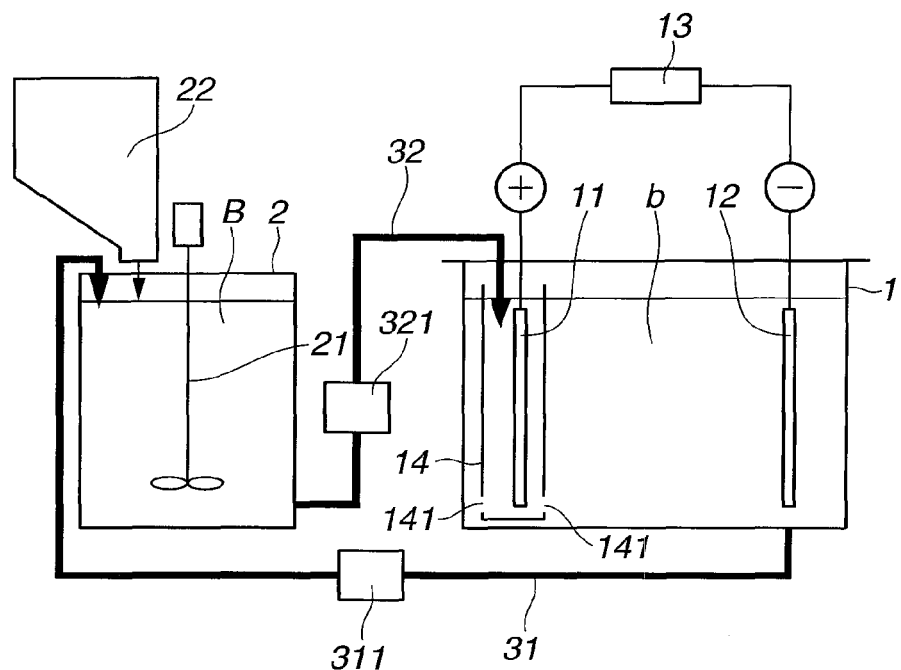
FIG. 3 is a schematic illustration of a further example of a plating apparatus suitable for preferred application of the continuous copper electroplating method according to the invention.

Specifically, for example, a configuration may be adopted in which, as shown in FIG. 2, an insoluble anode 11 is isolated by a membrane 14 which permits the plating bath (b) to transfer between the anode side and the cathode side of the membrane, and the plating bath is returned to the anode side of the membrane in returning the plating bath from the copper dissolution vessel to the plating vessel. In addition, particularly in the case where a membrane low in permeability to water such as an ion exchange membrane is used, it is preferable to provide the membrane 14 with liquid passage holes 141, as shown in FIG. 3, in order to prevent the liquid level of the plating bath on the anode side from being elevated by the return of the plating bath with the copper ion supplying salts dissolved therein and/or to obviate delay of the supply of the plating bath to the cathode side. For enhancing the efficiency of oxidation and decomposition, optimally, the liquid passage holes 141 are provided at positions as far as possible from the plating bath return position. Besides, in the present invention, the distance between the liquid passage holes 141 and the draw-out position of the plating bath (b) to be transferred from the plating vessel 1 to the copper dissolution vessel 2 is also preferably set large. Incidentally, those component members in FIGS. 2 and 3 which are the same as those in FIG. 1 are denoted by the same symbols used in FIG. 1, and descriptions of them are omitted here.

Preferable examples of the method by which the plating bath in the copper dissolution vessel being high in concentrations of the plating performance impairing components are efficiently put into the oxidizing atmosphere in the vicinity of the anode include, in addition to the above-mentioned, a method in which the plating bath returned from the copper dissolution vessel is ejected in the form of jets toward the insoluble anode or along the insoluble anode.

Figure 4:
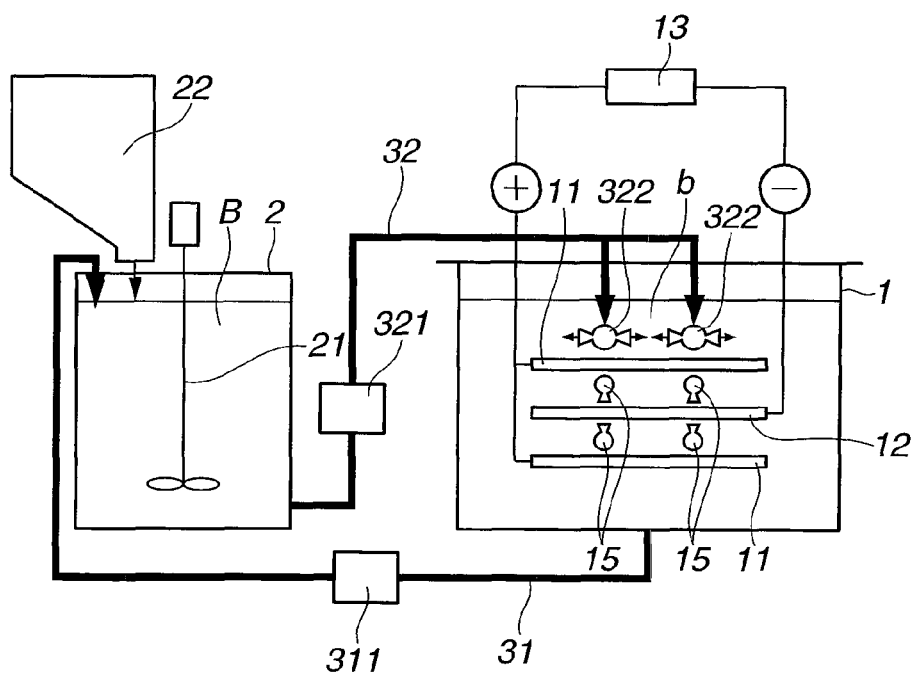
FIG. 4 is a schematic illustration of an example of a horizontal-type plating apparatus suitable for preferred application of the continuous copper electroplating method according to the invention.
Figure 5:
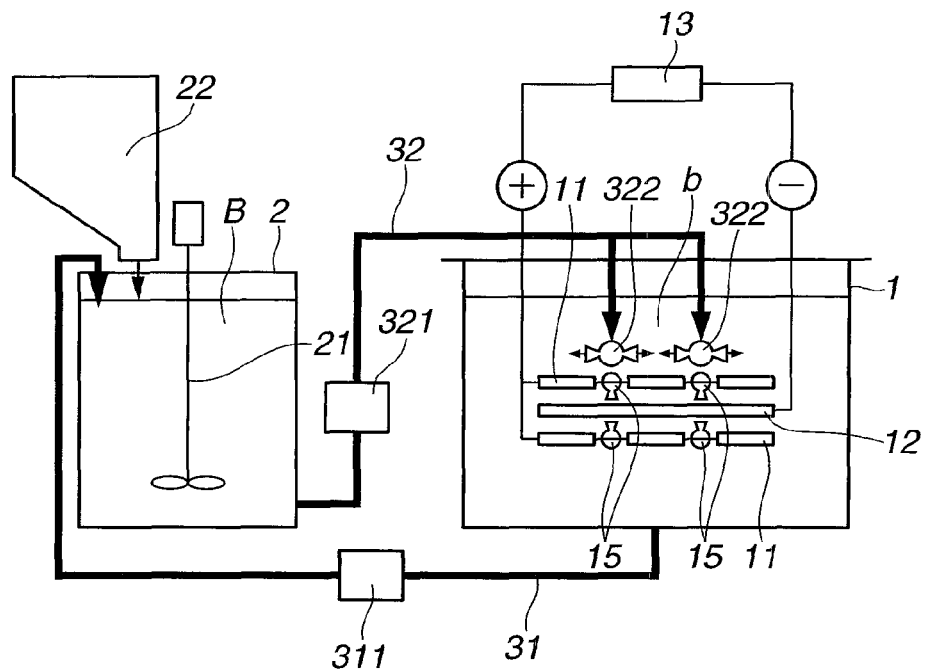
FIG. 5 is a schematic illustration of another example of a horizontal-type plating apparatus suitable for preferred application of the continuous copper electroplating method according to the invention.

For example, a horizontal-type plating apparatus as shown in FIGS. 4 and 5 can be used, in which return nozzles 322 for returning the plating bath (the plating bath in the copper dissolution vessel) B from the copper dissolution vessel 2 are provided in the vicinity of an insoluble anode 11 opposed in vertical direction to the workpiece to be plated 12, in this case, in the upper vicinity of the upper one 11 of two sheets of insoluble anodes 11, 11 which are opposed to the workpiece 12. Incidentally, in FIGS. 4 and 5, symbols 15 denote jet nozzles for agitating the plating bath (b) and jetting the plating bath (b) toward the workpiece 12, and the other component members are denoted by the same symbols as used in FIG. 1, descriptions of them being omitted. Here, FIG. 4 illustrates an example in which the jet nozzles 15 are arranged on the inner sides (the workpiece 12 side) relative to the insoluble anodes 11, while FIG. 5 illustrates an example in which the insoluble anodes 11 and the jet nozzles 15 are disposed at substantially the same levels.

Besides in the case of using the horizontal-type plating apparatus as shown in FIGS. 4 and 5, in order to make the most of the oxidizing action of oxygen evolved on the insoluble anode and to achieve efficient oxidation and decomposition of the components having adverse effects on plating, it is desirable to arrange the insoluble anode 11 on the upper side of the workpiece to be plated 12 and to return the plating bath (the plating bath in the copper dissolution vessel) B from the copper dissolution vessel 2 to the further upper side of the insoluble anode 11 provided on the upper side. In this case, preferably, the plating bath B is returned to a position between the insoluble anode 11 and the surface level of the plating bath (b), the distance from the anode 11 to the return position being not more than 30 cm, particularly, not more than 20 cm. For instance, in the example shown in FIGS. 4 and 5, the positions of the discharge ports of return nozzles 322 are preferably set in the just-mentioned range, thereby returning the plating bath B there. The discharge direction of the plating bath B is not particularly limited, but the plating bath B is preferably returned in the direction(s) along the anode (in the example shown in FIGS. 4 and 5, the horizontal directions).

Further, in the present invention, even if the copper ions produced by dissolution of the copper ion supplying salts are univalent copper ions ($Cu^+$) which have an unfavorable effect on plating characteristics, they would immediately be oxidized further into bivalent copper ions ($Cu^{2+}$) in the oxidizing atmosphere in the vicinity of the insoluble anode. Consequently, there is little effect of univalent copper ions.

The present invention is especially effective for copper sulfate plating baths containing an organic additive or additives. The organic additives include those which are added to copper sulfate electroplating baths and are called brightener, leveler, promoter, controlling agent, etc., examples thereof including nitrogen-containing organic compounds, sulfur-containing organic compounds and oxygen-containing organic compounds known as additives to copper sulfate electroplating baths.

Examples of the organic additives under consideration in the present invention will be mentioned below, with their concentrations in the copper sulfate plating bath. For example, in the case of a nitrogen-containing organic compound such as tertiary amine compounds and quaternary ammonium compounds known in the via-filling plating and damascene techniques, its concentration in the plating bath is preferably 0.01 to 1000 mg/L. In the case of a sulfur-containing organic compound such as disulfides, e.g., bis(3-sulfopropyl) disulfide (disodium salt) (SPS), 3-mercaptopropane-1-sulfonic acid (sodium salt) (MPS), etc. known in the via-filling plating and damascene techniques, its concentration is preferably 0.001 to 100 mg/L. In the case of an oxygen-containing organic compound such as polyether organic additives, e.g., polyethylene glycol known in the via-filling plating and damascene techniques, its concentration is preferably 0.001 to 5000 mg/L.

As the copper sulfate plating bath, the conventionally known ones can be used; particularly, those which contain 10 to 300 g/L as copper sulfate pentahydrate of copper components and 10 to 300 g/L of sulfuric acid are used preferably. Further, the copper sulfate plating bath preferably contains 5 to 200 mg/L of chloride ions ($Cl^-$). Incidentally, the pH of the copper sulfate plating bath is usually set to be not more than 2 (in the range from 0 to 2).

The insoluble anode, in general, is required to be low in oxygen evolution potential, and, in view of this, an anode of titanium coated with platinum, iridium oxide or the like is used. While such an anode can be used, in the present invention, other known insoluble anodes may also be used insofar as they are formed from insoluble material capable of evolving oxygen, without being converted into non-conductor, when an electric current is passed therethrough.

The cathode agitation may be conducted by conventionally known means such as jet agitation or circulatory agitation using a pump or the like, air agitation using an air pump, mechanical agitation by a paddle, cathode rocking, or the like.

As for the other components than copper (copper ions) of the above-described copper sulfate plating bath, the components depleted by the continuous copper electroplating are replenished by a conventionally known method, such as addition of replenishing liquids, as required, whereby the plating can be continued.

The continuous copper electroplating method according to the present invention is applicable to copper electroplating for forming a wiring pattern or the like on a workpiece to be plated, such as printed wiring boards and wafers, particularly, printed wiring boards and wafers and the like having at least a structure to be filled with copper by copper electroplating to form an embedded wiring, for example, blind via holes or trenches.

EXAMPLES

Now, the present invention will be described in detail below by showing Examples and Comparative Examples, which are not limitative of the invention.

Example 1

Substrates having via holes (125 μm in aperture diameter and 75 μm in depth) treated to be conductive, as workpieces to be plated, were subjected to continuous (repeated) plating by use of a plating apparatus provided with a membrane having liquid passage holes on the lower side of an anode, as shown in FIG. 3. The plating was conducted by use of Plating bath 1 shown below under the conditions of a current density of 1 A/dm$^2$ and a plating time per substrate of 1.5 hours, and the plated products were evaluated as to appearance and hole filling (plugging) performance. The results are shown in Table 1 below.

The bath amount in a plating vessel 1 was 350 L, the bath amount in a copper dissolution vessel 2 was 50 L and, hence, the total bath amount was 400 L. An electrode of titanium coated with iridium oxide was used as an insoluble anode, and an ion exchange membrane Nafion (registered trademark) produced by Du Pont was used as the membrane.

Easily soluble copper oxide (CuO) produced by Tsurumi Soda Co., Ltd. was used as a copper ion supplying salt, and the plating was repeated while keeping the copper ion concentration in the plating bath. This was done by a method in which copper oxide in an amount corresponding to the copper ion concentration consumed by the plating was supplied into the copper dissolution vessel 2 and dissolved in the plating bath on the basis of each batch of plating, and, while passing an electric current (during the execution of the next batch of plating), the plating bath with copper thus dissolved therein was returned from the copper dissolution vessel 2 to the inner side of the membrane (the anode side relative to the membrane) in the plating vessel 1. As for additive components, their concentrations in the plating bath were analyzed by CVS (cyclic voltammetry stripping), and the amounts of them having been consumed by plating were replenished.

[Composition of Plating Bath 1 (Upon Preparation)]
- Copper sulfate pentahydrate: 200 g/L
- Sulfuric acid: 50 g/L
- Chloride ion: 50 mg/L
- Bis(3-sulfopropyl)disulfide(disodium salt): 2 mg/L
- Polyethylene glycol (Mw=10000): 200 mg/L
- Janus Green B: 0.1 mg/L

Comparative Example 1

Continuous (repeated) plating of workpieces to be plated was conducted in the same manner as in Example 1 above, except that the plating bath with copper dissolved therein was returned from the copper dissolution vessel 2 to an intermediate point between anode and cathode on the outer side of the membrane (the cathode side relative to the membrane) in the plating vessel 1 so that the distance between the anode and the plating bath returning position was five times that in Example 1. The plated products were evaluated as to appearance and hole filling (plugging) performance. The results are shown in Table 1 below.

TABLE 1

| Continuous plating time (number of batches) [hr (times)] | Example 1 Appearance | Example 1 Hole filling performance (recess) | Comparative Example 1 Appearance | Comparative Example 1 Hole filling performance (recess) |
|---|---|---|---|---|
| 1.5 (1) | — | 6 μm | — | 5 μm |
| 12 (8) | A | 6 μm | B | 8 μm |
| 36 (24) | A | 7 μm | C | 60 μm |
| 90 (60) | A | 5 μm | C | 72 μm |

Appearance:
The appearance of each of the plated substrates was visually evaluated. The plated substrates having the same lustrous appearance as that obtained immediately upon start of the test (the first batch) were marked "A," the plate substrates showing whitish dull deposits were marked "B," and the plated substrates showing rough deposits were marked "C."

Hole Filling (Plugging) Performance:
The distance from the top surface level of the via hole to the center of the top face of the plating filling the via hole was taken as recess (plug loss).

Example 2

Substrates having through-holes (300 μm in aperture diameter and 1.6 mm in height (plate thickness)) treated to be conductive, as workpieces to be plated, were subjected to continuous (repeated) plating by use of a plating apparatus provided with a membrane as shown in FIG. 2. The plating was conducted by use of Plating bath 2 shown below under the conditions of a current density of 3 A/dm$^2$ and a plating time per substrate of 45 minutes, and the plated products were evaluated as to appearance and throwing power. The results are shown in Table 2 below.

The bath amount in the plating vessel 1 was 350 L, the bath amount in the copper dissolution vessel 2 was 50 L and, hence, the total bath amount was 400 L. An electrode of titanium coated with platinum was used as the insoluble anode, and an electrolytic diaphragm Yumicron produced by Yuasa Membrane Systems Co., Ltd. was used as the membrane.

Easily soluble copper oxide (CuO) produced by Tsurumi Soda Co., Ltd. was used as the copper ion supplying salt, and the plating was repeated while keeping the copper ion concentration in the plating bath. This was done by a method in which copper oxide in an amount corresponding to the copper ion concentration consumed by the plating was supplied into the copper dissolution vessel 2 and dissolved in the plating bath on the basis of each batch of plating, and, while passing an electric current (during the execution of the next batch of plating), the plating bath with copper thus dissolved therein was returned to the inner side of the membrane (the anode side relative to the membrane) in the plating vessel 1. As for additive components, their concentrations in the plating bath were analyzed by CVS (cyclic voltammetry stripping), and the amounts of them having been consumed were replenished.

[Composition of Plating Bath 2 (Upon Preparation)]
- Copper sulfate pentahydrate: 80 g/L
- Sulfuric acid: 200 g/L
- Chloride ion: 50 mg/L
- Bis(3-sulfopropyl)disulfide(disodium salt): 1 mg/L
- Polyethylene glycol (Mw=4000): 500 mg/L
- Polyethyleneimine: 0.5 mg/L

Comparative Example 2

Continuous (repeated) plating of workpieces to be plated was conducted in the same manner as in Example 2 above, except that the plating bath with copper dissolved therein was returned from the copper dissolution vessel 2 to an intermediate point between anode and cathode on the outer side of the membrane (the cathode side relative to the membrane) in the plating vessel 1 so that the distance between the anode and the plating bath returning position was five times that in Example 2. The plated products were evaluated as to appearance and throwing power. The results are shown in Table 2 below.

TABLE 2

| Continuous plating time | Example 2 | | Comparative Example 2 | |
|---|---|---|---|---|
| (number of batches) [hr (times)] | Appearance | Throwing power | Appearance | Throwing power |
| 0.75 (1) | — | 80% | — | 81% |
| 7.5 (10) | A | 81% | B | 76% |
| 22.5 (30) | A | 78% | B | 70% |
| 45 (60) | A | 82% | C | 62% |

Appearance:

The appearance of each of the plated substrates was visually evaluated. The plated substrates having the same lustrous appearance as that obtained immediately upon start of the test (the first batch) were marked "A," the plate substrates showing whitish dull deposits were marked "B," and the plated substrates showing rough deposits were marked "C."

Figure 6:
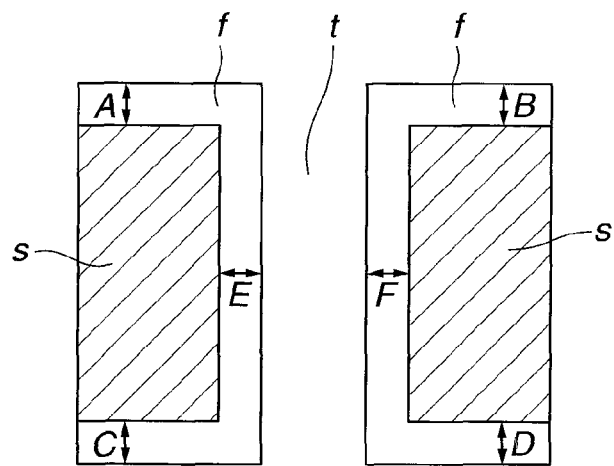
FIG. 6 is a sectional view of a plated-through hole, illustrating the locations of measurement of plating film thickness in evaluation of throwing power carried out in Example 2 and Comparative Example 2.

Throwing Power:

As shown in FIG. 6, a section including a through-hole (t) and the surroundings thereof was cut off from each plated substrate, and the section was observed to measure the film thickness of each of portions A to F of the plating film (f) on the substrate (s), and the throwing power was calculated from the film thickness values by the following formula:

Throwing power (%)=$(E+F) \times 2/(A+B+C+D) \times 100$

Example 3

Copper-clad laminates as workpieces to be plated were subjected to continuous (repeated) plating by use of a plating apparatus provided with a membrane having liquid passage holes on the lower side of the anode, as shown in FIG. 3. The plating was conducted by use of Plating bath 3 shown below under the conditions of a current density of 7 A/dm$^2$ and a plating time per laminate of 20 minutes, and the plated laminates were evaluated as to appearance. The results are shown in Table 3 below. Besides, after predetermined batches, the plating bath was sampled from the vicinity of the anode and the vicinity of the cathode, and the samples were served to measurement of copper concentration (as copper sulfate pentahydrate). The results of the measurement are also shown in Table 3.

The bath amount in the plating vessel 1 was 350 L, the bath amount in a copper dissolution vessel 2 was 50 L and, hence, the total bath amount was 400 L. An electrode of titanium coated with iridium oxide was used as the insoluble anode, and a polypropylene-made woven fabric having high liquid permeability was used as the membrane.

Easily soluble copper oxide (CuO) produced by Tsurumi Soda Co., Ltd. was used as the copper ion supplying salt. When the plating is conducted for three batches, the concentration of copper sulfate pentahydrate in the plating bath is lowered by 3 g/L. The copper oxide corresponding to 3 g/L of copper sulfate pentahydrate corresponds to 390 g of copper oxide based on 400 L of the plating bath. In view of this, the plating was continuously conducted by a method in which 390 g of copper oxide was supplied into the copper dissolution vessel and dissolved in the plating bath for one hour after each three batches of plating, and, while passing an electric current (during the execution of the next batch of plating), the plating bath with copper thus dissolved therein was returned from the copper dissolution vessel 2 to the inner side of the membrane (the anode side relative to the membrane) in the plating vessel 1. As for additive components, their concentrations in the plating bath were analyzed by CVS (cyclic voltammetry stripping), and the amounts of them having been consumed by plating were replenished.

[Composition of Plating Bath 3 (Upon Preparation)]
- Copper sulfate pentahydrate: 80 g/L
- Sulfuric acid: 200 g/L
- Chloride ion: 50 mg/L
- Bis(3-sulfopropyl)disulfide(disodium salt): 3 mg/L
- Polyethylene glycol (Mw=4000): 500 mg/L
- Polyethyleneimine: 0.5 mg/L

Comparative Example 3

Figure 7:
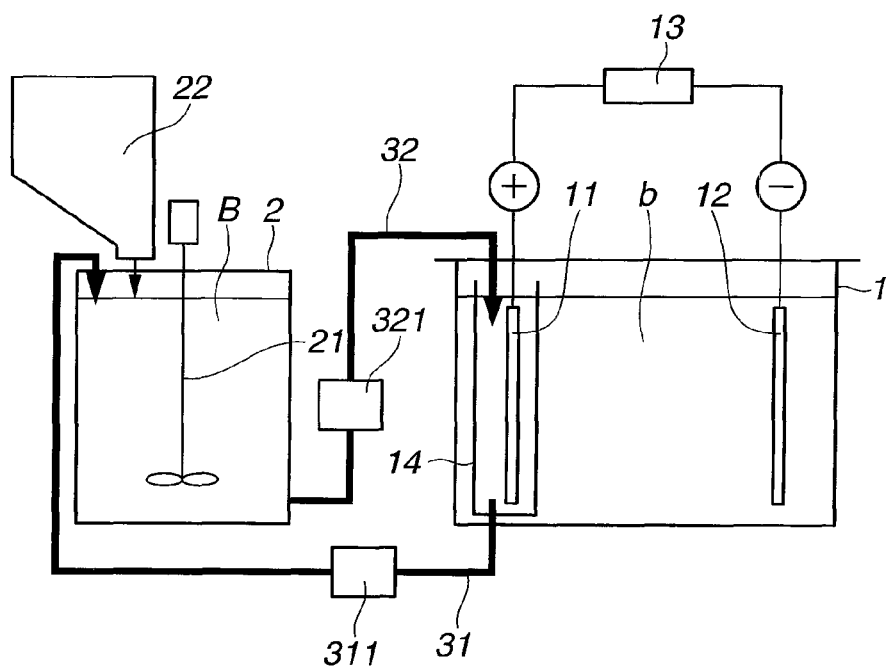
FIG. 7 is a schematic illustration of a plating apparatus used in Comparative Example 3.

Continuous (repeated) plating of workpieces to be plated was conducted in the same manner as in Example 3 above, except that an ion exchange membrane Nafion (registered trademark) produced by Du Pont having no liquid passage hole was used as the membrane and that a plating apparatus shown in FIG. 7 (the components in FIG. 7 are denoted by the same symbols as used in FIG. 2, and descriptions of the components are omitted here) in which the plating bath transferred from the plating vessel 1 to the copper dissolution vessel 2 is drawn out from the anode 11 side of the membrane (from the anode chamber) was used. The plated products were evaluated as to appearance. The results are shown in Table 3. After each batch, the plating bath was sampled from the vicinity of the anode and the vicinity of the cathode, and the samples were subjected to measurement of copper concentration (as copper sulfate pentahydrate), the results being also shown in Table 3.

TABLE 3

| | Example 3 | | | Comparative Example 3 | | |
|---|---|---|---|---|---|---|
| Total plating time (number of | Concentration of copper sulfate pentahydrate [g/L] | | | Concentration of copper sulfate pentahydrate [g/L] | | |
| batches) [hr (times)] | Anode side | Cathode side | Appearance | Anode side | Cathode side | Appearance |
| 1/3 (1) | 79.7 | 80.6 | A | 79.5 | 80.1 | A |
| 3 (9) | 82.1 | 78.1 | A | 90.1 | 69.1 | A |
| 6 (18) | 82.3 | 78.2 | A | 96.8 | 62.1 | A |
| 9 (27) | 82.2 | 77.9 | A | 102.1 | 57.6 | B |
| 12 (36) | 83.0 | 77.2 | A | 107.6 | 52.1 | B |
| 15 (45) | 83.1 | 78.1 | A | 112.4 | 47.6 | C |
| 18 (54) | 82.5 | 78.5 | A | 115.3 | 44.7 | C |

Appearance:

The appearance of each of the plated products was visually evaluated. The plated products having the same lustrous appearance as that obtained immediately upon start of the test (the first batch) were marked "A," the plated products showing whitish dull deposits were marked "B," and the plated products showing burnt deposits were marked "C."

In Comparative Example 3, the communication performance between the anode side and the cathode side partitioned by the membrane was low, so that only the copper ion concentration on the anode side was increased, while the copper ion concentration on the cathode side was simply lowered. As a result, the copper ion became deficient in the vicinity of the cathode, and the plating films would come to show burnt deposits. In Example 3, on the other hand, the communication performance between the anode side and the cathode side was high, so that the copper ion concentration in the vicinity of the cathode could be kept constant, and the lustrous appearance of the plating films could be maintained without generation of burnt deposits, as seen from the table.

The invention claimed is:

1. A method for a repeated electroplating of a workpiece to be plated as a cathode by using an insoluble anode in a plating vessel accommodating a copper sulfate plating bath, wherein
   a copper dissolution vessel different from the plating vessel is provided,
   the plating bath is transferred to the copper dissolution vessel and is returned from the copper dissolution vessel to the plating vessel for circulating the plating bath between the plating vessel and the copper dissolution vessel,
   copper oxide is charged into the copper dissolution vessel and dissolved in the plating bath so that copper ions consumed by the plating can be replenished, and
   the workpiece to be plated is continuously electroplated, characterized in that
   the anode and cathode isolated by a membrane which surrounds the anode and permits the plating bath to transfer between the anode side and cathode side, and
   the plating bath is transferred to a vicinity of the anode, between the anode and the membrane and in a direction along the anode, so that bubbles of oxygen gas in the vicinity of the anode are mixed with the transferred plating, bath, in said transport of the plating bath from the copper dissolution vessel to the plating vessel.

2. The method for a repeated electroplating of claim 1 wherein,
   the plating bath is transferred from a position which is nearer to the cathode than the anode in said transport of the plating bath from the plating vessel to the copper dissolution vessel.

3. The method for a repeated electroplating of claim 1 wherein, the insoluble anode is an anode of titanium coated with platinum or iridium oxide.

4. The method for a repeated electroplating of claim 1 wherein, the membrane has a plurality of liquid passage holes.

* * * * *